(12) United States Patent
Spiess et al.

(10) Patent No.: US 7,431,858 B2
(45) Date of Patent: Oct. 7, 2008

(54) NANOIMPRINT RESIST

(75) Inventors: Walter Spiess, Muenster (DE); Fumio Kita, Wiesbaden (DE); Michael Meier, Liederbach (DE); Andreas Gier, Melle (DE); Martin Mennig, Quierschied (DE); Peter W Oliveira, Saarbruecken (DE); Helmut Schmidt, Saarbruecken-Guedingen (DE)

(73) Assignee: AZ Electronic Materials (Germany) GmbH, Weisbaden (DE)

( * ) Notice: Subject to any disclaimer, the term of this patent is extended or adjusted under 35 U.S.C. 154(b) by 332 days.

(21) Appl. No.: 10/511,402

(22) PCT Filed: Apr. 9, 2003

(86) PCT No.: PCT/EP03/03666

§ 371 (c)(1),
(2), (4) Date: May 3, 2005

(87) PCT Pub. No.: WO03/087935

PCT Pub. Date: Oct. 23, 2003

(65) Prior Publication Data

US 2005/0224452 A1    Oct. 13, 2005

(30) Foreign Application Priority Data

Apr. 17, 2002  (DE)  ................. 102 17 151

(51) Int. Cl.
*B44C 1/22* (2006.01)
*C03C 15/00* (2006.01)
*C03C 25/68* (2006.01)
*C23F 1/00* (2006.01)

(52) U.S. Cl. ................... 216/67; 216/41; 216/58; 264/129; 264/219; 264/239

(58) Field of Classification Search ............... 216/67, 216/41, 58; 264/129, 219, 239; 438/694; 427/256; 257/622; 430/56
See application file for complete search history.

(56) References Cited

U.S. PATENT DOCUMENTS

| | | | | |
|---|---|---|---|---|
| 4,557,797 A | * | 12/1985 | Fuller et al. | 438/514 |
| 6,440,864 B1 | * | 8/2002 | Kropewnicki et al. | 438/710 |
| 6,954,275 B2 | * | 10/2005 | Choi et al. | 356/614 |
| 2003/0099897 A1 | * | 5/2003 | Fedynyshyn | 430/192 |

OTHER PUBLICATIONS

Haoying Li et al. (Journal of Nanoparticle Research, 3 (2001), pp. 157-160).*

* cited by examiner

*Primary Examiner*—Binh X Tran
*Assistant Examiner*—Mahmoud Dahimene
(74) *Attorney, Agent, or Firm*—Alan P. Kass

(57) ABSTRACT

The invention relates to a method for microstructuring electronic components, which yields high resolutions ($\leq 200$ nm) at a good aspect ratio while being significantly less expensive than photolithographic methods. The inventive method comprises the following steps: i) a planar unhardened sol film of a nanocomposite composition according to claim 1 is produced; ii) a target substrate consisting of a bottom coat (b) and a support (c) is produced; iii) sol film material obtained in step i) is applied to the bottom coat (b) obtained in step ii) by means of a microstructured transfer embossing stamp; iv) the applied sol film material is hardened; v) the transfer embossing stamp is separated, whereby an embossed microstructure is obtained as a top coat (a). The method for producing a microstructured semiconductor material comprises the following additional steps: vi) the remaining layer of the nanocomposite sol film is plasma etched, preferably with $CHF_3/O_2$ plasma; vii) the bottom coat is plasma etched, preferably with $O_2$ plasma; viii) the semiconductor material is etched or the semiconductor material is doped in the etched areas.

17 Claims, No Drawings

NANOIMPRINT RESIST

This application is a United States National Stage Patent Application under 35 U.S.C. § 371 of International Patent Application No. PCT/EP03/03666, filed Apr. 9, 2003, which claims priority to German Patent Application No. 102 17 151.3, filed Apr. 17, 2002.

The present invention is in the area of microlithography.

The miniaturization of electronic components, for which a resolution down to the range of less than 1 μm is required, has been achieved substantially by photolithographic techniques. The limit of resolution is predetermined by the wavelength of the radiation used for reproducing the original, so that short-wave radiation, such as high-energy UV radiation, electron beams and X-rays, must be used.

Owing to the occurrence of diffraction effects in the case of increasingly small structures, structuring by photolithography reaches its physical limits, which are about 150 nm. On the other hand, the increasingly high requirements with respect to resolution, wall slope and aspect ratio (ratio of height to resolution) result in a cost explosion in the case of the apparatuses required for photolithographic structuring, such as masks, mask aligners and steppers.

In particular, owing to their price of several million US$, modern steppers are a considerable cost factor in microchip production.

It was therefore the object of the present invention to develop a method for the microstructuring of electronic components which gives high resolutions (≦200 nm) in combination with a good aspect ratio but is substantially more economical than photolithographic methods.

U.S. Pat. No. 5,772,905 describes a nanoimprint method which is based on a thermoplastic deformation of the resist, applied to the whole surface of a substrate, by a relief present on a rigid stamp. Thermoplastics (polymethyl methacrylate, PMMA) are used as a resist for hot stamping. Owing to conventional thickness variations of about 100 nm over the total wafer surface, it is not possible to structure 6, 8 and 12 inch wafers in one step with a rigid stamp. Thus, a complicated "step and repeat" method would have to be used, which, however, is unsuitable owing to the reheating of already structured neighboring areas.

WO 99/22 849 discloses a microstructuring method which takes a different approach. There, a flexible polydimethylsiloxane stamp having the desired microstructure is placed on a flat, inorganic substrate. As a result of the capillary forces, a liquid is subsequently drawn into the structure. This is an aqueous TEOS solution. The solvent is removed by osmosis and a porous $SiO_2$ structure remains behind. These layers are used predominantly in biomimetics (composites for teeth and bones).

In U.S. Pat. Nos. 5,900,160, 5,925,259 and 5,817,242, a stamp is wet with a UV-curable resist (self-assembled monolayer, e.g. alkylsiloxane) and then pressed onto a smooth substrate. Analogously to a conventional stamp process, the structured resist material remains when the stamp is raised from the substrate surface. The resist materials used exhibit sufficient wetting with respect to the substrate but are not suitable for a lift-off method, nor do they have sufficient etch resistance. The structure dimensions are in the region of 1 μm and are thus more than 1 order of magnitude too large.

These methods are all unsuitable for achieving the object according to the invention.

It has been found that the abovementioned requirements can be met by a mechanical transfer stamping method if a specific nanocomposite composition is used as a transfer resist (nanoimprint resist).

The present invention relates to the use of a nanocomposite composition, comprising a) a polymerizable silane of the general formula (I) and/or (II) and/or condensates derived therefrom

$$SiX_4 \quad (I)$$

in which the radicals X are identical or different and are hydrolyzable groups or hydroxyl group;

$$R^1{}_a R^2{}_b SiX_{(4-a-b)} \quad (II)$$

in which $R^1$ is a nonhydrolyzable radical, $R^2$ is a radical carrying a functional group, X has the above meaning and a and b have the value 0, 1, 2 or 3, the sum (a+b) having the value 1, 2 or 3, and b) nanoscale particles selected from the group consisting of the oxides, sulfides, selenides, tellurides, halides, carbides, arsenides, antimonides, nitrides, phosphides, carbonates, carboxylates, phosphates, sulfates, silicates., titanates, zirconates, aluminates, stannates, plumbates and mixed oxides thereof, as a resist for the microstructuring of semiconductor materials, flat screens, micromechanical components and sensors.

In the above formulae, the hydrolyzable groups X are, for example, hydrogen or halogen, such as F, Cl, Br or I; alkoxy, preferably $C_{1-6}$-alkoxy, such as, for example, methoxy, ethoxy, n-propoxy, isopropoxy and butoxy; aryloxy, preferably $C_{6-10}$-aryloxy, such as, for example, phenoxy; acyloxy, such as, for example, acetoxy or propionyloxy; alkylcarbonyl, preferably $C_{2-7}$-alkylcarbonyl, such as, for example, acetyl; amino, monoalkylamino or dialkylamino having preferably 1 to 12, in particular 1 to 6, carbon atoms in the alkyl group or groups.

The nonhydrolyzable radical $R^1$ is, for example, alkyl, preferably $C_{1-6}$-alkyl, such as, for example, methyl, ethyl, n-propyl, isopropyl, n-butyl, isobutyl and tert-butyl, pentyl, hexyl or cyclohexyl; alkenyl, preferably $C_{2-6}$-alkenyl, such as, for example, vinyl, 1-propenyl, 2-propenyl and butenyl; alkynyl, preferably $C_{2-6}$-alkynyl, such as, for example, acetylenyl and propargyl; and aryl, preferably $C_{6-10}$-aryl, such as, for example, phenyl and naphthyl..

Said radicals $R^1$ and X can, if desired, have one or more conventional substituents, such as, for example, halogen or alkoxy.

Specific examples of the functional groups of the radical $R^2$ are epoxy, hydroxyl, ether, amino, monoalkylamino, dialkylamino, amido, carboxyl, mercapto, thioether, vinyl, acryloyloxy, methacryloyloxy, cyano, halogen, aldehyde, alkylcarbonyl, sulfo and phosphoric acid groups. These functional groups are preferably bonded to the silicon atom via alkylene, alkenylene or arylene bridge groups which may be interrupted by oxygen or sulfur atoms or —NH— groups. Said bridge groups are derived, for example, from the abovementioned alkyl, alkenyl or aryl radicals. The bridge groups of the radicals $R^2$ preferably contain 1 to 18, in particular 1 to 8, carbon atoms.

In the general formula (II), a preferably has the value 0, 1 or 2, b preferably has the value 1 or 2 and the sum (a+b) preferably has the value 1 or 2.

Particularly preferred hydrolyzable silanes of the general formula (I) are tetraalkoxysilanes, such as tetraethoxysilane (TEOS) and tetramethoxysilane. Particularly preferred organosilanes of the general formula (II) are epoxysilanes, such as 3-glycidyloxypropyltrimethoxysilane (GPTS) or 3-glycidyloxypropyltriethoxysilane, and silanes having reactive polymerizable double bonds, such as, for example, acryloyloxypropyltrimethoxysilane or 3-methacryloyloxypropyltrimethoxysilane. Said silanes or the functional groups thereof are preferred because (after hydrolytic polycondensation is complete) they can be used for a polyaddition or polymerization reaction with, for example, the polymerizable mono- and/or bifunctional organic monomers, oligomers and/or polymers and/or react with reactive groups present on the surface of the nanoscale particles and can thus contribute to the immobilization (for example by incorporation into a network) of the nanoscale particles.

The hydrolysis and polycondensation of the above compounds is carried out in a conventional manner, if desired in the presence of an acidic or basic condensation catalyst, such as HCl, $HNO_3$ or $NH_3$. Thus, hydrolysis and polycondensation can be effected, for example, under the (generally known) conditions of the sol-gel process.

The volume fraction of the nanoscale particles in the nanocomposite composition is expediently from 1 to 50% by volume, preferably from 1 to 30% by volume and in particular from 5 to 20% by volume.

The nanoscale particles usually have a particle size of from 1 to 200 nm, preferably from 2 to 50 nm and in particular from 5 to 20 nm.

Nanoscale inorganic particles as such as known, for example from WO 96/31572, and are, for example, oxides, such as CaO, ZnO, CdO, $SiO_2$, $TiO_2$, $ZrO_2$, $CeO_2$, $SnO_2$, PbO, $Al_2O_3$, $In_2O_3$ and $La_2O_3$; sulfides, such as CdS and ZnS; selenides, such as GaSe, CdSe or ZnSe; tellurides, such as ZnTe or CdTe; halides, such as NaCl, KCl, $BaCl_2$, AgCl, AgBr, AgI, CuCl, CuBr, $CdI_2$ or $PbI_2$; carbides, such as $CeC_2$; arsenides, such as AlAs, GaAs or CeAs; antimonides, such as InSb; nitrides, such as BN, AlN, $Si_3N_4$ or $Ti_3N_4$; phosphides, such as GaP, InP, $Zn_3P_2$ or $Cd_3P_2$; carbonates, such as $Na_2CO_3$, $K_2CO_3$, $CaCO_3$, $SrCO_3$ and $BaCO_3$; carboxylates, e.g. acetates, such as $CH_3COONa$ and $Pb(CH_3COO)_4$; phosphates; sulfates; silicates; titanates; zirconates; aluminates; stannates; plumbates and corresponding mixed oxides whose composition preferably corresponds to the composition of conventional glasses having a low coefficient of thermal expansion, e.g. binary, tertiary or quaternary combinations of $SiO_2$, $TiO_2$, $ZrO_2$ and $Al_2O_3$.

Also suitable are, for example, mixed oxides having the perovskite structure, such as Ba $TiO_3$ or $PbTiO_3$. In addition, organically modified inorganic particles, such as, for example, particulate polymethylsiloxanes, methacryloyl-functionalized oxide particles and salts of methylphosphoric acid may be used.

These nanoscale particles can be produced in a conventional manner, for example by flame hydrolysis, flame pyrolysis and plasma methods according to the literature mentioned in WO 96/31 572. Stabilized colloidal, nanodisperse sols of inorganic particles, such as, for example, silica sols from BAYER, $SnO_2$— sols from Goldschmidt, $TiO_2$ sols from MERCK, $SiO_2$, $ZrO_2$, $Al_2O_3$ and $Sb_2O_3$ sols from Nissan Chemicals or Aerosil dispersions from DEGUSSA, are particularly preferred.

The nanoscale particles can be changed in their viscosity behavior by surface modification.

Suitable surface modifiers, i.e. surface-modifying low molecular weight organic (=carbon-containing) compounds which have at least one functional group which can react and/or (at least) interact with groups present on the surface of the powder particles and with the polymer matrix, are in particular compounds having a molecular weight which is not higher than 500, preferably not higher than 350 and in particular not higher than 200.

Such compounds are preferably liquid under standard temperature and pressure conditions and preferably have altogether not more than 15, in particular altogether not more than 10 and particularly preferably not more than 8 carbon atoms. The functional groups which these compounds must carry depend primarily on the surface groups of the nanoscale material used in each case and moreover on the desired interaction with the polymer matrix. Thus, an acid/base reaction according to Bronsted or Lewis can take place, for example, between the functional groups of the surface-modifying compound and the surface groups of the particles (including complex formation and adduct formation). An example of another suitable interaction is the dipole-dipole interaction. Examples of suitable functional groups are carboxyl groups, (primary, secondary, tertiary and quaternary) amino groups and C—H-acidic groups (e.g. β-diketones). A plurality of these groups may also be present simultaneously in a molecule (betaines, amino acids, EDTA).

Accordingly, examples of preferred surface modifiers are saturated or unsaturated mono- and polycarboxylic acids (preferably monocarboxylic acids) having 1 to 12 carbon atoms (e.g. formic acid, acetic acid, propionic acid, butyric acid, pentanoic acid, hexanoic acid, acrylic acid, methacrylic acid, crotonic acid, citric acid, adipic acid, succinic acid, glutaric acid, oxalic acid, maleic acid and fumaric acid) and their esters (preferably $C_1$-$C_4$-alkyl esters) and amides, e.g. methyl methacrylate.

Examples of further suitable surface modifiers are imides and quaternary ammonium salts of the formula $N^+R^{10}R^{20}R^{30}R^{40}Y^-$ in which $R^{10}$ to $R^{40}$ are aliphatic, aromatic or cycloaliphatic groups which may differ from one another and which have preferably 1 to 12, in particular 1 to 6, carbon atoms and $Y^-$ is an inorganic or organic anion, e.g. Cl or acetate; mono- and polyamines, in particular those of the general formula $R_{3-n}NH_n$, in which n is 0, 1 or 2 and the radicals R, independently of one another, are alkyl groups having 1 to 12, in particular 1 to 6 and particularly preferably 1 to 4 carbon atoms, e.g. methyl, ethyl, n-propyl, isopropyl and butyl, and ethylenepolyamines, e.g. ethylenediamine, diethylenetriamine; amino acids; imines; β-dicarbonyl compounds having 4 to 12, in particular 5 to 8, carbon atoms, such as, for example, acetylacetone, 2,4-hexanedione, 3,5-heptanedione, acetoacetic acid and $C_1$-$C_4$-alkyl acetoacetates; and modified alcoholates in which some of the OR groups (R as defined above) are substituted by inert organic groups.

For the electrostatic stabilization of the nanoscale particles, for example, the compounds known for this purpose, such as, for example, NaOH, $NH_3$, KOH, $Al(OH)_3$ or tetramethylammonium hydroxide, may also be used.

The nanocomposite compositions used according to the invention may furthermore contain polymerizable monofunctional and/or bifunctional organic monomers, oligomers and/or polymers from the group consisting of (poly)acrylic acid, (poly)methacrylic acid, (poly)acrylates, (poly)methacrylates, (poly)acrylamides, (poly)methacrylamides, (poly)carbamides, (poly)olefins, (poly)styrene, (poly)amides, (poly)imides, (poly)vinyl compounds, (poly)esters, (poly)arylates, (poly)carbonates, (poly)ethers, (poly)etherketones, (poly)sulfones, (poly)epoxides, fluorine polymers, organo(poly)siloxanes, (poly)siloxanes and hetero(poly)siloxanes.

Examples are (poly)vinyl chloride, (poly)vinyl alcohol, (poly)vinylbutyral, corresponding copolymers, e.g. poly(ethylene-vinyl acetate), polyethylene terepthalate, polyoxymethylene, polyethylene oxide or polyphenylene oxide, organopolysiloxanes or heteropolysiloxanes formed with metals and transition metals, as described, for example, in EP-A-36 648 and EP-A-223 067, and mixtures of two or more of these polymers, provided that they are compatible with one another. Instead of said polymers, their oligomers and/or precursors (monomers) may also be used.

Among these polymers, polymers, such as polyacrylates, polymethacrylates (e.g. PMMA), glycidyl ethers, such as, for example, bisphenol A diglycidyl ether, and polyvinylbutyral, which are soluble in organic solvents are particularly preferred.

The polymerizable monofunctional and/or bifunctional organic monomers, oligomers and/or polymers may be present in an amount of from 0 to 20 mol %, preferably from 0.1 to 15 mol %, in particular from 1 to 10 mol %, based on the polymerizable silane.

A preferred nanocomposite composition furthermore contains a fluorosilane of the formula (III)

$$R^3(X^1)_3Si \quad (III)$$

in which $R^3$ is a partly fluorinated or perfluorinated $C_2$-$C_{20}$-alkyl and $X^1$ is $C_1$-$C_3$-alkoxy, methyl, ethyl or chlorine.

Partly fluorinated alkyl is understood as meaning those alkyl radicals in which at least one hydrogen atom is replaced by a fluorine atom.

Preferred radicals $R^3$ are $CF_3CH_2CH_2$, $C_2F_5CH_2CH_2$, $C_4F_9CH_2CH_2$, n-$C_6F_{13}CH_2CH_2$, n-$C_8F_{17}CH_2CH_2$, n-$C_{10}F_{21}CH_2CH_2$ and i-$C_3F_7O$—$(CH_2)_3$.

Examples of fluorosilanes of the formula (III), which are also commercially available, are tridecafluoro-1,1,2,2-tetrahydrooctyl-1-triethoxysilane,  $CF_3CH_2CH_2SiCl_2CH_3$, $CF_3CH_2CH_2SiCl(CH_3)_2$, $CF_3CH_2CH_2Si(CH_3)(OCH_3)_2$, i-$C_3F_7O$—$(CH_2)_3SiCl_2CH_3$, n-$C_6F_{13}CH_2CH_2SiCl_2CH_3$ and n-$C_6F_{13}CH_2CH_2SiCl(CH_3)_2$.

The fluorosilanes of the formula (III) may be present in an amount of from 0 to 3% by weight, preferably from 0.05 to 3% by weight, particularly preferably from 0.1 to 2.5% by weight, in particular from 0.2 to 2% by weight, based on the total weight of the nanocomposite composition. The presence of fluorosilanes is required in particular when a glass or silica glass stamp is used as the transfer imprint stamp.

The nanocomposite composition expediently contains a polymerization, polyaddition and/or polycondensation catalyst which can thermally and/or photochemically induce crosslinking and curing (referred to collectively as "crosslinking initiator").

Photoinitiators used may be, for example, the commercially available initiators. Examples of these are Irgacure® 184 (1-hydroxycyclohexyl phenyl ketone), Irgacure® 500 (1-hydroxycyclohexyl phenyl ketone, benzophenone) and other photoinitiators of the Irgacure® type available from Ciba; Darocur® 1173, 1116, 1398, 1174 and 1020 (available from Merck), benzophenone, 2-chlorothioxanthone, 2-methylthioxanthone, 2-isopropylthioxanthone, benzoin, 4,4'-dimethoxybenzoin, benzoin ethyl ether, benzoin isopropyl ether, benzil dimethyl ketal, 1,1,1-trichloroacetophenone, diethoxyacetophenone and dibenzosuberone.

Suitable thermal initiators are, inter alia, organic peroxides in the form of diacyl peroxides, peroxydicarbonates, alkyl peresters, dialkyl peroxides, perketals, ketone peroxides and alkyl hydroperoxides. Specific examples of such thermal initiators are dibenzoyl peroxide, tert-butyl perbenzoate and azobisisobutyronitrile.

When used, the crosslinking initiator is usually employed in an amount of from 0.1 to 5, preferably from 0.5 to 3, % by weight, based on the nanocomposite composition.

The invention furthermore relates to a microlithographic arrangement comprising a) a microstructured layer of a nanocomposite composition as a top coat;
b) a bottom coat comprising an aromatics-containing (co) polymer containing novolaks, styrenes, (poly)hydroxystyrenes and/or (meth)acrylates;
c) a substrate.

The substrate is preferably a semiconductor material to be structured, e.g. a silicon wafer or indium tin oxide layers on glass.

The bottom coat present thereon should have good adhesion both to the top coat a) and to the substrate and preferably has a layer thickness of from about 0.1 to 20 μm.

The invention furthermore relates to a method for the production of such a microlithographic arrangement, comprising the steps:

i) production of an uncured sol film of the nanocomposite composition described above;
ii) production of a target substrate comprising bottom coat b) and substrate c);
iii) transfer of sol film material from i) by means of a microstructured transfer imprint stamp to the bottom coat b) in ii);
iv) curing of the transferred sol film material;
v) removal of the transfer imprint stamp to give an imprinted microstructure as top coat a).

The uncured sol film i) is expediently applied to a planar arrangement, comprising a support, e.g. glass, silica glass, plastic or silicon wafer, and/or an adhesion-promoting film. The adhesion-promoting film contains organic polymers which ensure good wetting with respect to the support and the nanocomposite sol film to be deposited thereon. The adhesion-promoting film may comprise, for example, an aromatics-containing polymer or copolymer, containing novolaks, styrenes, (poly)hydroxystyrenes and/or (meth)acrylates. The adhesion-promoting film can be applied to the support by known methods, such as, for example, spin coating.

The nanocomposite composition according to the invention is then applied as a sol film to the adhesion-promoting film, expediently in a film thickness of from 0.5 to 1 μm, by known methods, such as, for example, spin coating, spray coating or roller coating. The sol film preferably has a viscosity of from 80 mPa s to 2 Pa s, preferably from 100 mPa s to 1 Pa s and particularly preferably from 200 mPa s to 600 mPa s.

The nanocomposite composition can be applied either as such or preferably as a solution in an organic solvent. Examples of suitable solvents are alcohols, such as butanol, ketones, such as acetone, esters, such as ethyl acetate, ethers, such as tetrahydrofuran, and aliphatic, aromatic and halogenated hydrocarbons, such as hexane, benzene, toluene and chloroform.

The nanocomposite composition can be prepared, for example, by dispersing the nanoscale particles in one of the abovementioned solvents and/or one of said polymerizable compounds, for example with stirring or by means of ultrasonics. The dispersion obtained is then mixed with the other components of the nanocomposite composition, if required with dilution with a solvent. The solvent used for dilution is either identical to the solvent used for the dispersion or miscible therewith.

If the solvent used does not evaporate during the application of the nanocomposite sol film, it is expedient substantially to remove the solvent after application of the film by suitable measures, such as, for example, heating, since otherwise transfer of the sol film material by means of a transfer imprint stamp is problematic.

The target substrate can be produced by the same methods. The bottom coat can have a composition which is the same as or similar to that of the above-described adhesion-promoting film of the starting substrate.

After application of the nanocomposite sol and evaporation of the solvent in air, the fluorosilane molecules have accumulated at the surface, into which the glass or silica glass transfer imprint stamp is then pressed for from about 5 to 300 seconds, preferably from 10 to 60 seconds (immersion time).

The transfer imprint stamp may also consist of silicone rubber. In this case, no fluorosilanes of the formula (III) are required.

The fluorinated side chains of the fluorosilane molecules are in principle repelled by the hydrophilic surface of the glass or silica glass stamp and only weakly attracted by the surface of the adhesion-promoting film or of the substrate, and therefore diffuse in a concentration gradient. After said immersion time, the transfer imprint stamp is pulled out of the excess nanocomposite sol film. The adhesion of the sol film material in the 30 to 500 nm, preferably 100 to 200 nm, deep and broad microchannels of the stamp due to capillary forces and due to partial removal of the fluorosilane molecules from the (silica) glass surface is sufficiently great for it to be picked up by the stamp. If the immersion time is not reached, the transfer is incomplete. The transfer of the microstructure to the target substrate is effected by the air, preferably in the course of from 10 to 300 seconds. The fluorosilane accumulates at the interface with the air, so that the wetting of the stamp is very good and the sol does not contract to a drop in the transfer stamp.

After the transfer stamp is placed on the bottom coat b) of the target substrate, the stamp is pressed against the bottom coat b) for a duration of from 10 to expediently 300 seconds, preferably from 20 to 50 seconds, in particular from 30 to 40 seconds, under a pressure of from 10 to 100 kPa. During this, the fluorosilane diffuses back in the direction of the (silica) glass surface, so that, after curing, the adhesion to the bottom coat is sufficiently good and that to the transfer stamp is sufficiently poor. The layer thickness of the transferred material is from 50 to 1 000 nm, preferably from 150 to 500 nm.

If the same nanocomposite sol were to be used without fluorosilane and transferred by means of a silica glass stamp, no structure would be deposited on the target substrate. The sol remains completely in the stamp.

While the transfer imprint stamp rests on the bottom coat, thermal curing or UV curing takes place. In the case of UV-transparent transfer stamps, curing by UV radiation is preferred. After heating to about 80 to 150° C. for from about 1 to 10 minutes and/or UV irradiation for from about 5 to 20 minutes, the transferred sol film material has cured and the transfer imprint stamp is removed to give an imprinted microstructure (top coat a).

An investigation of this microstructured arrangement with the aid of a scanning electron microscope shows that not only the imprinted microstructure remains behind on the target substrate but also an unstructured residual layer of the nanocomposite sol film having a thickness of less than 30 nm.

For subsequent use in microelectronics, it is necessary for the nanocomposite sol film and the bottom coat to have different etch resistance in order to achieve a steep wall slope and a high aspect ratio (ratio of height of the lands to distance between two lands).

Thus, the nanocomposite composition used according to the invention can be etched with a $CHF_3/O_2$ gas mixture but not by an oxygen plasma. In the case of the bottom coat, the opposite is true.

The present invention therefore also relates to a method for the production of a microstructured semiconductor material, comprising the abovementioned steps i) to v), support c) being the semiconductor material to be structured, and the steps vi) plasma etching of the residual layer of the nanocomposite sol film, preferably with $CHF_3/O_2$ plasma, vii) plasma etching of the bottom coat, preferably with $O_2$ plasma, viii) doping of the semiconductor material in the etched areas, or etching of the semiconductor material.

After the etching process, the resist coating can be removed by means of conventional solvents, such as, for example, tetramethylammonium hydroxide.

Scanning electron micrographs show that, after the method according to the invention, nanostructures having an edge length of about 150 nm and a wall slope of about 90° are imprinted.

EXAMPLES

1) Preparation of a Nanocomposite Composition 236.1 g (1 mol) of glycidyloxypropyltrimethoxysilane (GPTS) are refluxed with 27 g (1.5 mol) of water for 24 hours. Methanol formed is then stripped off on a rotary evaporator at 70° C.

345 g of tetrahexylammonium hydroxide-modified silica sol ($SiO_2$ colloid, diameter about 10 nm, about 30% strength by weight in isopropanol, modified with 2.4 mg of tetrahexylammonium hydroxide solution (40% strength by weight in water) per g of silica sol) are added, with stirring, to the GPTS condensate thus prepared. The isopropanol is then removed in a rotary evaporator. In each case 1% by weight, based on the sol, of a cationic photoinitiator (UVI 6974, Union Carbide) and tridecafluoro-1,1,2,2-tetrahydrooctyl-1-triethoxysilane, and 22.3 g (0.0714 mol) of bisphenol A diglycidyl ether, are added to the solvent-free sol.

The sol is diluted by adding isopropoxyethanol until a nanocomposite composition having a viscosity of about 300 mPa s is obtained.

2) Preparation of the Novolak for Starting Substrate and Target Substrate:

120 g of m-cresol, 60 g of p-cresol and 106.8 g of 37% strength by weight formalin are heated together with 4 g of oxalic acid dihydrate for 6 hours at 100° C. For the removal of water and unconverted cresol, formaldehyde and oxalic acid by distillation, the reaction mixture is heated to 200° C. and the pressure is reduced to 50 mbar. 172 g of novolak are obtained as a solid.

3) Production of the Starting Substrate:

a) A 4 inch silicon wafer pretreated with hexamethyldisilazane is coated in a spin coater with a novolak solution (17.5 g of the novolak prepared above in 82.3 g of PGMEA). A softbake is then effected for 90 s at 110° C. and a hardbake for 90 s at 235° C., so that the resulting layer thickness is about 500 nm (adhesion-promoting layer).

b) The nanocomposite composition prepared above is applied by spin coating (2 000 revolutions, 30 s) to the adhesion-promoting layer thus prepared. For removal of the solvent, the sol film is dried for 1 minute at about 25° C. without the sol film curing.

The layer thickness of the nanocomposite sol film is about 500 nm.

4) Production of the Target Substrate:

The target substrate is produced analogously to 3).

5) Transfer and Imprinting of the Microstructure onto the Target Substrate:

The imprinting apparatus is a computer-controlled test machine (Zwick 1446 model) which makes it possible to program loading and relief speeds and to maintain defined pressures over a specific time. The force transmission is effected via a shaft to which the imprinting stamp is fastened by means of a joint. This permits the exact orientation of the imprint structure relative to the substrate. A metal halide lamp (UV-S400 model from Panacol-Elosol GmbH, UV-A radiation 325-380 nm) serves for the photochemically initiated curing.

A microstructured silica glass stamp (4×4 cm, structure depth 200 nm) is pressed under a force of 40 N into the uncured sol film of the starting substrate produced above. After a waiting time of 15 s, the stamp is pulled out of the excess sol film. The stamp now completely wet with sol film material is held in the air for 30 s, then placed on the target substrate produced above and pressed for 35 s with a force of 50 N onto the bottom coat, the transferred film being cured by the UV lamp. After an imprinting and exposure time of 5 minutes altogether, the stamp is removed and the cured microstructured sol film material is retained on the target substrate. A scanning electron micrograph of the coating shows that structures having a geometry of 150 nm×150 nm with a steep wall slope are reproduced. A residual layer thickness of 25 mm of sol film material is present between bottom coat and the transferred structures.

6) Etching Process

The substrate was etched under the following conditions:
1) with $CHF_3/O_2$ (25:10), 300 W, 50 mmHg, RIE mode, anisotropic; for removal of the residual top coat;
2) with $O_2$, 300 W, 50 mmHg, RIE mode, anisotropic; for removal of the bottom coat.

Aspect ratio about 3.

The invention claimed is:

1. A microlithographic arrangement comprising
   a) a microstructured layer of a nanocomposite composition comprising
      a1) a polymerizable silane of the general formula (I) and/or (II) and/or condensates derived therefrom $$SiX_4 \tag{I}$$

in which the radicals X are identical or different and are hydrolyzable groups or hydroxyl groups;

$$R^1_a R^2_b SiX_{(4-a-b)} \tag{II}$$

in which $R^1$ is a nonhydrolyzable radical, $R^2$ is a radical carrying a functional group, X has the above meaning and a and b have the value 0, 1, 2 or 3, the sum (a+b) having the value 1, 2 or 3, and
      a2) nanoscale particles selected from the group consisting of the oxides, sulfides, selenides, tellurides, halides, carbides, arsenides, antimonides, nitrides, phosphides, carbonates, carboxylates, phosphates, sulfates, silicates, titanates, zirconates, aluminates, stannates, plumbates and mixed oxides thereof, as a top coat;
   b) a bottom coat comprising an aromatics-containing polymer or copolymer containing novolaks, styrenes, (poly)hydroxystyrenes and/or (meth)acrylates;
   c) a substrate.

2. The microlithographic arrangement as claimed in claim 1, wherein the top coat a) is a sol film.

3. The microlithographic arrangement as claimed in claim 1, wherein the substrate c) is a semiconductor material.

4. The microlithographic arrangement as claimed in claim 1, wherein the nanocomposite composition contains from 1 to 50 percent by volume of nanoparticles.

5. The microlithographic arrangement as claimed in claim 1, where the nanoscale particles have been surface-modified with compounds selected from the group consisting of the carboxylic acids, carboxamides, carboxylic esters, amino acids, β-diketones, imides, quaternary ammonium salts of the general formula $N^+R^{10}R^{20}R^{30}R^{40}Y^-$, where the radicals $R^{10}$ to $R^{40}$ are identical or different and are aliphatic, aromatic and/or cycloaliphatic groups and $Y^-$ is an inorganic or organic anion.

6. The microlithographic arrangement as claimed in claim 1, wherein the nanocomposite composition contains polymerizable monofunctional monomers, bifunctional monomers, oligomers and/or polymers selected from the group consisting of (poly)acrylic acid, (poly)methacrylic acid, (poly)acrylates, (poly)methacrylates, (poly)acrylamides, (poly)methacrylamides, (poly)carbamides, (poly)olefins, (poly)styrene, (poly)amides, (poly)imides, (poly)vinyl compounds, (poly)esters, (poly)arylates, (poly)carbonates, (poly)ethers, (poly)etherketones, (poly)sulfones, (poly)epoxides, fluorine polymers, organo(poly)siloxanes, (poly)siloxanes and hetero(poly)siloxanes.

7. The microlithographic arrangement as claimed in claim 1, where the nanocomposite composition contains a fluorosilane of the formula (III)

$$R^3(X^1)_3Si \tag{III}$$

in which
$R^3$ is a partly fluorinated or perfluorinated $C_2$-$C_{20}$-alkyl and
$X^1$ is $C_1$-$C_3$-alkoxy, chlorine, methyl or ethyl.

8. The microlithographic arrangement as claimed in claim 1, wherein the nanocomposite composition contains a crosslinking initiator.

9. A method for the production for microlithographic arrangement as claimed in claim 1, comprising the steps:
   i) production of a planar uncured sol film of said nanocomposite;
   ii) production of a target substrate comprising a bottom coat b) and a support c);
   iii) transfer of sol film material from i) by means of a microstructured transfer imprint stamp to the bottom coat b) in ii);
   iv) curing of the transferred sol film material;
   v) removal of the transfer imprint stamp to give an imprinted microstructure as top coat a).

10. The method as claimed in claim 9, wherein the uncured sol film i) is applied to a planar starting substrate comprising a support and/or an adhesion-promoting film.

11. The method as claimed in claim 9, wherein the transfer imprint stamp comprises silicone, glass or silica glass.

12. The method as claimed in claim 9, wherein the transfer imprint stamp is pressed into the sol film i) for from 5 to 300 seconds, then removed and placed on the bottom coat b) in the course of from 10 to 300 seconds and pressed against b) for a time of from 10 to 300 seconds under a pressure of from 10 to 100 kPa.

13. The method as claimed in claim 9, wherein thermal curing or UV curing is carried out while the transfer imprint stamp is pressed against b).

14. A method for the production of a microstructured semiconductor material, comprising the steps i) to v) as claimed in claim 9, support c) being the semiconductor material to be structured, and the steps
- vi) plasma etching of the residual layer of the nanocomposite sol film,
- vii) plasma etching of the bottom coat,
- viii) etching of the semiconductor material or doping of the semiconductor material in the etched areas.

15. The microlithographic arrangement as claimed in claim 1, wherein the nanocomposite composition contains from 1 to 30 percent by volume of nanoparticles.

16. The method of claim 14 wherein for step vi), the plasma etching is done with $CHF_3/O_2$ plasma.

17. The method of claim 14 wherein for step vii), the plasma etching is done with $O_2$ plasma.

* * * * *

UNITED STATES PATENT AND TRADEMARK OFFICE
CERTIFICATE OF CORRECTION

PATENT NO. : 7,431,858 B2  Page 1 of 1
APPLICATION NO. : 10/511402
DATED : October 7, 2008
INVENTOR(S) : Walter Spiess et al.

It is certified that error appears in the above-identified patent and that said Letters Patent is hereby corrected as shown below:

On the Title Page, Item (73) should read
--Assignee: AZ Electronic Materials (Germany) GmbH. Wiesbaden (DE)--.

Signed and Sealed this

Sixteenth Day of December, 2008

JON W. DUDAS
*Director of the United States Patent and Trademark Office*